United States Patent
Alleva et al.

(10) Patent No.: US 11,378,625 B2
(45) Date of Patent: Jul. 5, 2022

(54) MOTOR VEHICLE BATTERY WEAR MONITORING SYSTEM AND METHOD

(71) Applicant: BRIDGESTONE EUROPE NV/SA [BE], Zaventem (BE)

(72) Inventors: Lorenzo Alleva, Rome (IT); Marco Pascucci, Rome (IT)

(73) Assignee: Bridgestone Europe, N.V./S.A. [BE/BE], Zaventem (BE)

( * ) Notice: Subject to any disclaimer, the term of this patent is extended or adjusted under 35 U.S.C. 154(b) by 70 days.

(21) Appl. No.: 17/252,033

(22) PCT Filed: Jun. 20, 2019

(86) PCT No.: PCT/IB2019/055201
§ 371 (c)(1),
(2) Date: Dec. 14, 2020

(87) PCT Pub. No.: WO2020/003070
PCT Pub. Date: Jan. 2, 2020

(65) Prior Publication Data
US 2021/0255247 A1     Aug. 19, 2021

(30) Foreign Application Priority Data
Jun. 29, 2018   (IT) ........................ 102018000006826

(51) Int. Cl.
*G01R 31/392*   (2019.01)
*G01R 31/3835*   (2019.01)
(Continued)

(52) U.S. Cl.
CPC ...... *G01R 31/3647* (2019.01); *F02N 11/0862* (2013.01); *G01R 31/3835* (2019.01);
(Continued)

(58) Field of Classification Search
CPC ........... F02N 11/0862; F02N 2200/062; F02N 2200/063; F02N 2200/14; G07C 5/008; G07C 5/0808; G07C 5/0816
See application file for complete search history.

(56) References Cited

U.S. PATENT DOCUMENTS 6,424,157 B1 * 7/2002 Gollomp ................. B60L 58/12
324/426
7,148,653 B2 * 12/2006 Mauro ............. G01R 19/16542
320/104
(Continued)

OTHER PUBLICATIONS

Interational Searching Authority: International Search Report for co-pending patent application No. PCT/B2019/055201 dated Nov. 11, 2019.
(Continued)

*Primary Examiner* — Phutthiwat Wongwian
*Assistant Examiner* — Arnold Castro
(74) *Attorney, Agent, or Firm* — Patterson Intellectual Property Law, P.C.

(57) ABSTRACT

The invention concerns a motor vehicle battery wear monitoring system (1,1A,1B) that includes an acquisition device (11) and a processing device/system (12,12A,12B). The acquisition device (11) is: installed onboard a motor vehicle (2) that is equipped with an internal combustion engine, a battery for providing a battery voltage ($V_B$), an alternator, and a starter motor for starting up the internal combustion engine; and configured to receive the battery voltage ($V_B$) and to output quantities indicative of said battery voltage ($V_B$). The processing device/system (12,12A,12B) is: configured to receive the quantities indicative of the battery voltage ($V_B$) from the acquisition device (11); and programmed to perform a battery voltage monitoring based on the quantities indicative of the battery voltage ($V_B$) to detect an approaching battery failure. The battery voltage moni-
(Continued)

toring includes detecting for each start-up of the internal combustion engine: a respective first voltage value ($V_{MIN}$) that is a minimum value assumed by the battery voltage (VB) just after the starter motor has started operating to start up the internal combustion engine; and a respective second voltage value ($V_2$) assumed by the battery voltage ($V_B$) just after the internal combustion engine has been started up, the starter motor has stopped operating and the alternator has started operating. The battery voltage monitoring further includes for each start-up of the internal combustion engine: computing a respective voltage rise value ($\Delta V_R$) indicative of a difference between the respective first ($V_{MIN}$) and second ($V_2$) voltage values; and detecting an approaching battery failure if the respective voltage rise value ($\Delta V_R$) meets a predefined condition with respect to a predefined voltage rise threshold ($T_{\Delta VR}$).

20 Claims, 3 Drawing Sheets

(51) Int. Cl.
    *G01R 31/36*    (2020.01)
    *F02N 11/08*    (2006.01)
    *G07C 5/00*    (2006.01)
    *G07C 5/08*    (2006.01)

(52) U.S. Cl.
    CPC ........... *G01R 31/392* (2019.01); *G07C 5/008* (2013.01); *G07C 5/0808* (2013.01); *G07C 5/0816* (2013.01); *F02N 2200/062* (2013.01); *F02N 2200/063* (2013.01); *F02N 2200/14* (2013.01)

(56) References Cited

U.S. PATENT DOCUMENTS

| | | | |
|---|---|---|---|
| 7,218,118 | B1 | 5/2007 | Gonring |
| 8,972,213 | B2* | 3/2015 | Zhang ................. G01R 31/392 702/65 |
| 2004/0130325 | A1 | 7/2004 | Marco et al. |
| 2009/0070052 | A1* | 3/2009 | Taniguchi ............ G01R 31/367 702/63 |
| 2009/0322340 | A1 | 12/2009 | Xiaodong et al. |
| 2009/0326841 | A1 | 12/2009 | Xiaodong et al. |

OTHER PUBLICATIONS

J. Otjens: "A battery's heartbeat, How to estimate the state of health of an online battery by the use of non-invasive measuring methods," Jan. 10, 2017, pp. 1-104, XP055571875, Tu Delft Repository Retrieved from the internet URL:https://repository.tudelft.nl/islandora/object/uuid:fa46fa41-0241-4aee-82a2-=2e42e557b1230/datastream/OBJ/download.

* cited by examiner

MOTOR VEHICLE BATTERY WEAR MONITORING SYSTEM AND METHOD

CROSS-REFERENCE TO RELATED APPLICATIONS

This application claims priority from Italian Patent Application No. 102018000006826 filed on Jun. 29, 2018, the disclosure of which is incorporated by reference.

TECHNICAL FIELD OF THE INVENTION

The present invention relates to a system and a method for monitoring wear of a motor vehicle battery to detect and, hence, predict an approaching battery failure.

STATE OF THE ART

As is broadly known, after some years of operation, an automotive battery (in particular, a battery of a motor vehicle fitted with an internal combustion engine (ICE)) normally gives out, without the driver being appropriately warned.

In fact, the main task of a motor vehicle battery is to power the starter motor to start up the ICE. Like any other component, a motor vehicle battery is subject, with use, to deterioration that leads the battery, after some years of operation, to become unable to start up the ICE.

Typically, a motor vehicle equipped with a battery in poor condition cannot be run at all and, since a driver is normally unable to predict (or rather has no tool for predicting) a battery failure, no servicing is carried out until a failure actually occurs.

Therefore, in the automotive sector there is markedly felt the need for technologies capable of determining the charge state of motor vehicle batteries and/or of detecting batteries' poor operating conditions, so that appropriate servicing may be carried out in time.

For example, a known solution of this kind is provided in EP 1 396 729 B1, which relates to a method of diagnosing a motor vehicle battery. In particular, the method according to EP 1 396 729 B1 comprises:
  sensing, at each start-up of the vehicle engine, a plurality of parameters including an initial value of the battery voltage just before the start-up of the vehicle engine, a drop of the battery voltage just after the start-up of the vehicle engine, and a rise time of the battery voltage, wherein said parameters are sensed by means of a voltage sensor connected to the terminals of the battery to receive the battery voltage;
  selecting a database corresponding to a current operating condition of the engine and the battery among a number of databases, each associated with a respective operating condition of the engine and the battery, wherein the operating conditions of the engine and the battery are defined by sets of values of at least one operating quantity including an air temperature and a water temperature;
  entering the sensed parameters into the selected database; and
  determining a charge state of the battery by comparing the sensed parameters with the content of the selected database.

Moreover, U.S. Pat. No. 7,218,118 B1 discloses a method for monitoring the condition of a battery of a marine propulsion system, which method includes measuring a voltage characteristic of the battery, comparing the voltage characteristic to a preselected threshold value, and evaluating the condition of the battery as a function of the relative magnitudes of the voltage characteristic and the threshold value. In particular, the voltage characteristic of the battery is measured subsequent to a connection event when a connection relationship between the battery and an electrical load is changed. The electrical load is typically a starter motor which is connected in torque transmitting relation with an internal combustion engine. The voltage characteristic is preferably measured at its minimum value during the inrush current episode immediately prior to cranking the internal combustion engine shaft to start the engine.

Additionally, further examples of methods/systems for determining the charge state of motor vehicle batteries and/or for detecting batteries' poor operating conditions are provided in:
  US 2009/326841 A1, which concerns a pattern recognition approach applied to battery diagnosis and prognosis, and which discloses a method for determining a state-of-health of a battery in a vehicle during an engine cranking phase, wherein
    characteristic data is recorded that includes battery voltage data and engine cranking speed data during the engine cranking phase,
    the characteristic data is provided to a pre-processing unit that normalizes the characteristic data for processing within a classifier,
    the normalized data is input to the classifier for determining the vehicle battery state-of-health,
    the classifier has a trained state-of-health decision boundary resulting from a plurality of trials in which predetermined characterization data is collected with known classes, and
    the battery state-of-health is classified based on the trained state-of-health decision boundary;
  US 2009/322340 A1, which concerns a method for determining a battery's state-of-health, wherein
    an initial battery voltage is measured after a first voltage drop during an initiation of an engine cranking phase,
    a battery voltage is monitored during the remainder of the engine cranking phase,
    a lowest battery voltage is determined during the remainder of the engine cranking phase,
    a determination is made if a voltage difference between the lowest battery voltage and the initial battery voltage at the initiation of the engine cranking phase is less than a voltage threshold, and
    a low battery state-of-health is identified in response to the voltage difference being less than the voltage threshold; and
  J. Otjens, "A battery's heartbeat: How to estimate the state of health of an online battery by use of non-invasive measuring methods", 10 Jan. 2017, pages 1-104, XP055571875, wherein several methods for measuring voltage cranking trace (including the one according to US 2009/326841 A1) to monitor a battery's state-of-health are disclosed.

OBJECT AND SUMMARY OF THE INVENTION

Object of the present invention is that of providing a technology for monitoring wear of a motor vehicle battery to detect/predict an approaching failure of the motor vehicle battery, so that appropriate servicing may be carried out in time, which technology is more efficient, accurate and reliable than currently known technologies, such as the solutions according to EP 1 396 729 B1, U.S. Pat. No.

7,218,118 B1, US 2009/326841 A1, US 2009/322340 A1, and "A battery's heartbeat: How to estimate the state of health of an online battery by use of non-invasive measuring methods".

This and other objects are achieved by the present invention in that it relates to a motor vehicle battery wear monitoring system, as defined in the appended claims.

In particular, the present invention concerns a motor vehicle battery wear monitoring system that includes an acquisition device and a processing device/system, wherein the acquisition device is:
  installed on board a motor vehicle that is equipped with an internal combustion engine, a battery for providing a battery voltage, an alternator, and a starter motor for starting up the internal combustion engine; and
  configured to receive the battery voltage and to output quantities indicative of said battery voltage.

The processing device/system is:
  configured to receive the quantities indicative of the battery voltage from the acquisition device; and
  programmed to perform a battery voltage monitoring based on the quantities indicative of the battery voltage to detect an approaching battery failure.

In particular, the battery voltage monitoring includes detecting for each start-up of the internal combustion engine:
  a respective first voltage value that is a minimum value assumed by the battery voltage just after the starter motor has started operating to start up the internal combustion engine; and
  a respective second voltage value assumed by the battery voltage just after the internal combustion engine has been started up, the starter motor has stopped operating and the alternator has started operating.

Additionally, the battery voltage monitoring further includes for each start-up of the internal combustion engine:
  computing a respective voltage rise value indicative of a difference between the respective first and second voltage values; and
  detecting an approaching battery failure if the respective voltage rise value meets a predefined condition with respect to a predefined voltage rise threshold.

Preferably, the battery voltage monitoring includes also:
  detecting an anomalous current drain from the battery when the motor vehicle is at rest with the internal combustion engine being off; and
  detecting an approaching battery failure if, when the motor vehicle is at rest with the internal combustion engine being off, the battery voltage becomes lower than a predefined battery voltage threshold.

BRIEF DESCRIPTION OF THE DRAWINGS

For a better understanding of the present invention, preferred embodiments, which are intended purely by way of non-limiting examples, will now be described with reference to the attached drawings (all not to scale), where.

DETAILED DESCRIPTION OF PREFERRED EMBODIMENTS OF THE INVENTION

The following discussion is presented to enable a person skilled in the art to make and use the invention. Various modifications to the embodiments will be readily apparent to those skilled in the art, without departing from the scope of the present invention as claimed. Thence, the present invention is not intended to be limited to the embodiments shown and described, but is to be accorded the widest scope of protection consistent with the principles and features disclosed herein and defined in the appended claims.

The present invention stems from the observation of typical trend of motor vehicle battery voltage over time before and during vehicle engine cranking (or start-up).

Figure 1:
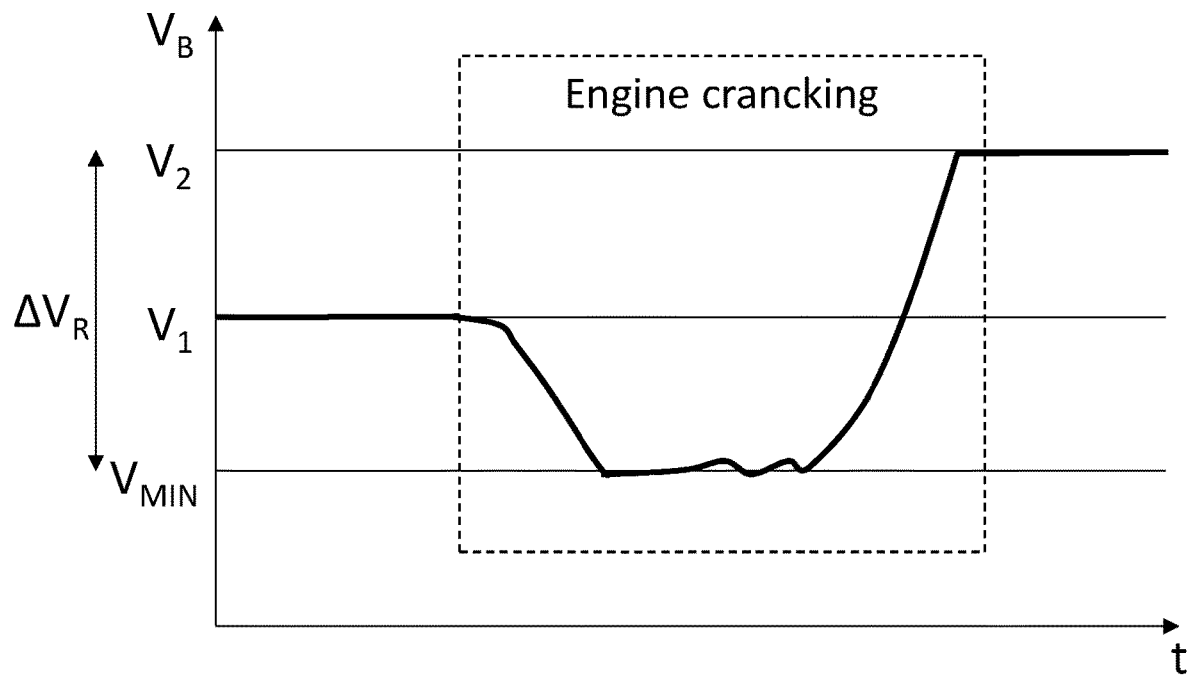
FIG. 1 shows typical trend of motor vehicle battery voltage over time before and during vehicle engine cranking.

In this connection, FIG. 1 shows the typical trend of a battery voltage $V_B$ during cranking of an ICE. Before the start-up, the battery voltage $V_B$ has a stable initial value $V_1$ (typically equal to 12 V), since the battery substantially supplies no current. When the driver starts up the motor vehicle, the starter motor draws a high current so that the battery is temporarily unable to maintain the initial value $V_1$ of the voltage $V_B$, which drops very quickly to a minimum value $V_{MIN}$ (e.g., 10 V) and remains, more or less, at this minimum value $V_{MIN}$ for a transient period necessary for the starter motor to start up the ICE, after which the battery voltage $V_B$ rises very quickly up to a substantially steady value $V_2$ (e.g., 14 V) that is normally higher than the initial value $V_1$. In fact, after having started up the ICE, the starter motor stops operating and, hence, stops drawing current, while the alternator starts operating and, hence, charging the battery and powering onboard devices/systems.

Figure 2:
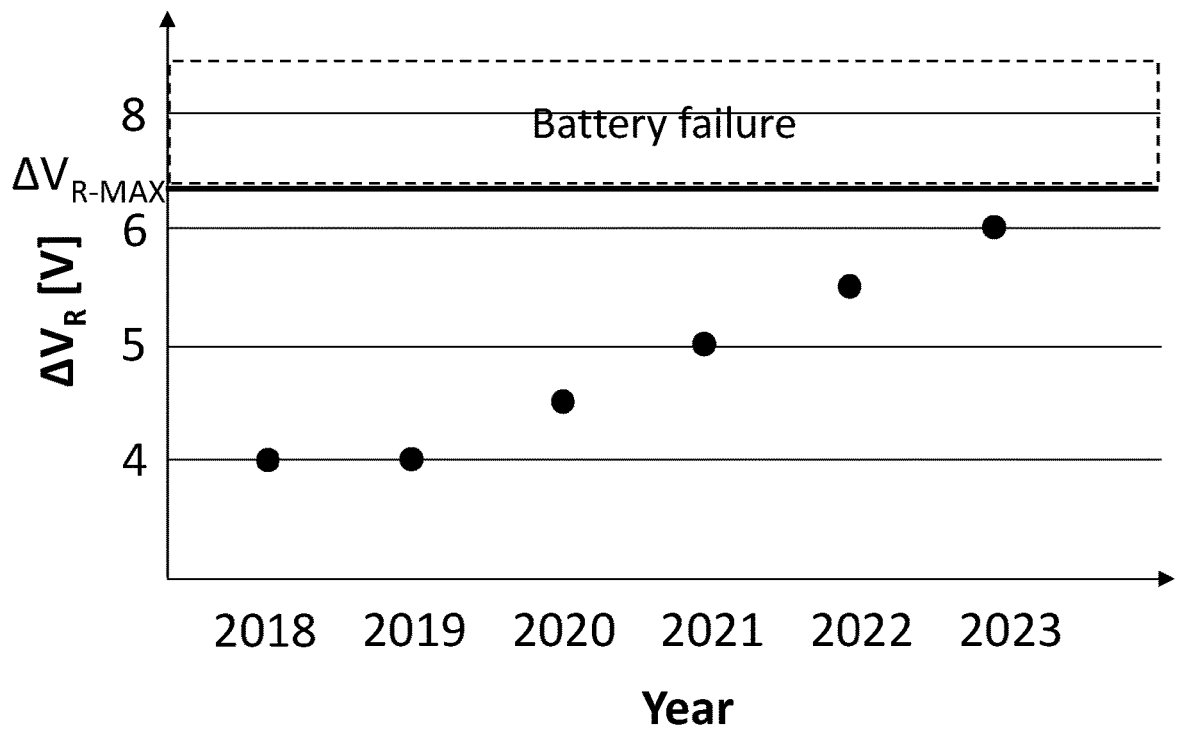
FIG. 2 shows an example of trend of voltage rise values related to engine cranking over years.

Thence, the Applicant has had the smart idea of monitoring the voltage rise value $\Delta V_R = V_2 - V_{MIN}$ to detect an approaching failure of a motor vehicle battery. In fact, the Applicant has noticed that, with use, this voltage rise value $\Delta V_R$ increases up to reach, after some years of operation of a motor vehicle battery, a maximum voltage rise value $\Delta V_{R-MAX}$ which does not allow engine cranking any longer. An example of this behaviour of the voltage rise value $\Delta V_R$ over years is shown in FIG. 2.

Therefore, it is possible to determine, based on experimental tests and/or computer simulations, the maximum voltage rise value $\Delta V_{R-MAX}$ and, hence, a voltage rise threshold $T_{\Delta V_R}$ that is lower than said maximum voltage rise value $\Delta V_{R-MAX}$ (conveniently, by a given safety tolerance value, such as a given safety tolerance percentage of said maximum voltage rise value $\Delta V_{R-MAX}$). Then, the reaching of said voltage rise threshold $T_{\Delta V_R}$ by the voltage rise value $\Delta V_R$ may advantageously trigger a warning of an approaching battery failure.

Additionally, according to a further aspect of the present invention, the battery voltage $V_B$ is conveniently monitored over time also when the motor vehicle is at rest with the engine being off. In fact, in this way it is possible to:
  detect an anomalous current drain from the battery (e.g., due to the fact that the radio/lights has/have been left on), which fact could cause the battery to become unable to start the engine; and
  check whether the battery voltage $V_B$ (which, in case of engine being off, should have the aforesaid value $V_1$) lowers over time, which fact could prevent the battery from managing to start up the engine.

In particular, by monitoring the battery voltage $V_B$ over time, it is possible to check whether, when the motor vehicle is at rest with the engine being off, the battery voltage $V_B$ becomes lower than a predefined battery voltage threshold $T_{VB}$, which fact triggers an alert relating to an approaching battery failure.

Figure 3:
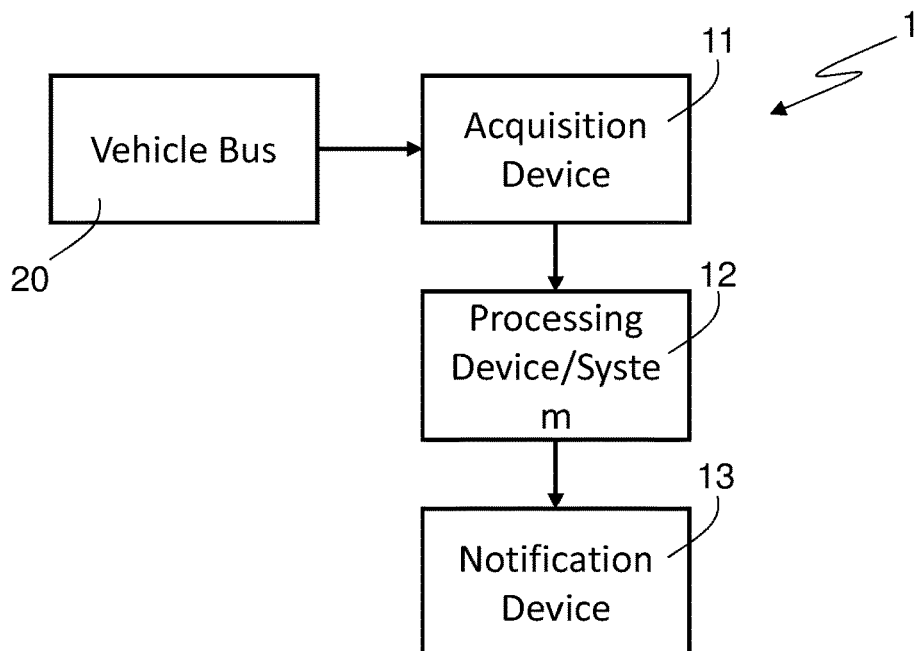
FIG. 3 schematically illustrates a motor vehicle battery wear monitoring system according to a preferred embodiment of the present invention.

For a better understanding of the present invention, FIG. 3 schematically illustrates (in particular, by means of a block diagram) a functional architecture of a motor vehicle battery wear monitoring system (denoted as a whole by 1) according to a preferred embodiment of the present invention.

In particular, the motor vehicle battery wear monitoring system 1 includes:
- an acquisition device 11, which is
  - installed on board a motor vehicle (not shown in FIG. 3—e.g., a scooter, a motorbike, a car, a van, a truck, etc.) fitted with an ICE, a battery, an alternator, and a starter motor for starting up the ICE (wherein the ICE, the battery, the alternator and the starter motor are not shown in FIG. 3),
  - coupled to a vehicle bus 20 (e.g., based on Controller Area Network (CAN) bus standard) of said motor vehicle to receive/acquire/be supplied with a battery voltage $V_B$ (i.e., a voltage supplied by the battery of said motor vehicle), and
  - configured to output quantities indicative of the battery voltage $V_B$; and
- a processing device/system 12, which is connected, in a wired or wireless fashion, to the acquisition device 11 to receive therefrom the quantities indicative of the battery voltage $V_B$, and which is programmed to
  - compute, for each start-up of the ICE, based on the quantities indicative of the battery voltage $V_B$, a voltage rise value $\Delta V_R$ indicative of a difference between
    - a minimum value $V_{MIN}$ of the battery voltage $V_B$ (i.e., a minimum value $V_{MIN}$ assumed by the battery voltage $V_B$) just after the starter motor has started operating to start up the ICE, and
    - a substantially steady value $V_2$ of the battery voltage $V_B$ (i.e., a value $V_2$ assumed by the battery voltage $V_B$) just after the ICE has been started up, the starter motor has stopped operating and the alternator has started operating, and
  - detect an approaching battery failure based on the computed voltage rise value $\Delta V_R$.

As far as the acquisition device 11 is concerned, it is important to note that its connection to the vehicle bus 20 to receive/acquire/be supplied with the battery voltage $V_B$ represents only an option to carry out the present invention. In fact, alternatively, the acquisition device 11 might be conveniently connected directly to the terminals of the battery of the motor vehicle, or to an electrical line directly connected to the battery, or to an onboard electrical socket (such as an onboard cigarette/cigar lighter receptacle/socket), or even to an On-Board Diagnostics (OBD) power line or connector, to be powered and to output the quantities indicative of the battery voltage $V_B$.

Conveniently, the processing device/system 12 is configured to store a predefined voltage rise threshold $T_{\Delta VR}$, and is programmed to detect an approaching battery failure if the computed voltage rise value $\Delta V_R$ meets a predefined condition with respect to the predefined voltage rise threshold $T_{\Delta VR}$.

Obviously, the voltage rise value $\Delta V_R$ may be computed as $V_2-V_{MIN}$, or as $|V_{MIN}-V_2|$, or as $V_{MIN}-V_2$, wherein, since $V_2$ is higher than $V_{MIN}$, in the first and second cases (i.e., if $\Delta V_R=V_2-V_{MIN}$ or if $\Delta V_R=|V_{MIN}-V_2|$), an approaching battery failure is detected if $\Delta V_R=T_{\Delta VR}$ or if $\Delta V_R>T_{\Delta VR}$, whereas
in the third case (i.e., if $\Delta V_R=V_{MIN}-V_2$), an approaching battery failure is detected if $\Delta V_R=T_{\Delta VR}$ or if $\Delta V_R<T_{\Delta VR}$.

Conveniently, the acquisition device 11 is configured to produce the quantities indicative of the battery voltage $V_B$ by sampling the battery voltage $V_B$ with a predefined sampling frequency (e.g., equal to 100 Hz or higher) within a time window that starts at driver's engine ignition command and ends when the alternator starts operating. For example, the time window may have a 10-second time length. As far as the predefined sampling frequency is concerned, it is worth noting that said predefined sampling frequency is such that to enable accurately measuring rapid changes in the battery voltage $V_B$ during start-up of the ICE. Said predefined sampling frequency might depend on motor vehicle type. Anyway, generally speaking, the higher predefined sampling frequency, the better battery voltage change measuring.

Preferably, the processing device/system 12 is further programmed to monitor the battery voltage $V_B$, based on the quantities indicative of said battery voltage $V_B$, to detect an anomalous current drain from the battery and check whether the battery voltage $V_B$ lowers when the motor vehicle is at rest with the ICE being off.

More preferably, the processing device/system 12 is configured to store also a predefined battery voltage threshold $T_{VB}$, and is programmed to detect an approaching battery failure if, when the motor vehicle is at rest with the ICE being off, the battery voltage $V_B$ becomes lower than the predefined battery voltage threshold $T_{VB}$.

Conveniently, the acquisition device 11 is configured to produce the quantities indicative of the battery voltage $V_B$ by sampling the battery voltage $V_B$ with:
- a first predefined sampling frequency (e.g., equal to 100 Hz or higher) within a time window that starts when engine ignition is commanded by the driver and ends when the alternator starts operating; and
- a second predefined sampling frequency (e.g., equal to 1 Hz) outside said time window, wherein the second predefined sampling frequency is lower than the first sampling frequency.

As previously explained, the time window may have, for example, a 10-second time length.

Again with reference to FIG. 3, the motor vehicle battery wear monitoring system 1 further includes a notification device 13 configured to, if an approaching battery failure is detected by the processing device/system 12, warn a user associated with the motor vehicle (e.g., a driver and/or an owner thereof) against the approaching battery failure detected.

Preferably, the notification device 13 is further configured to, if an anomalous current drain from the battery is detected by the processing device/system 12, warn the user associated with the motor vehicle against the detected anomalous current drain from the battery.

Figure 4:
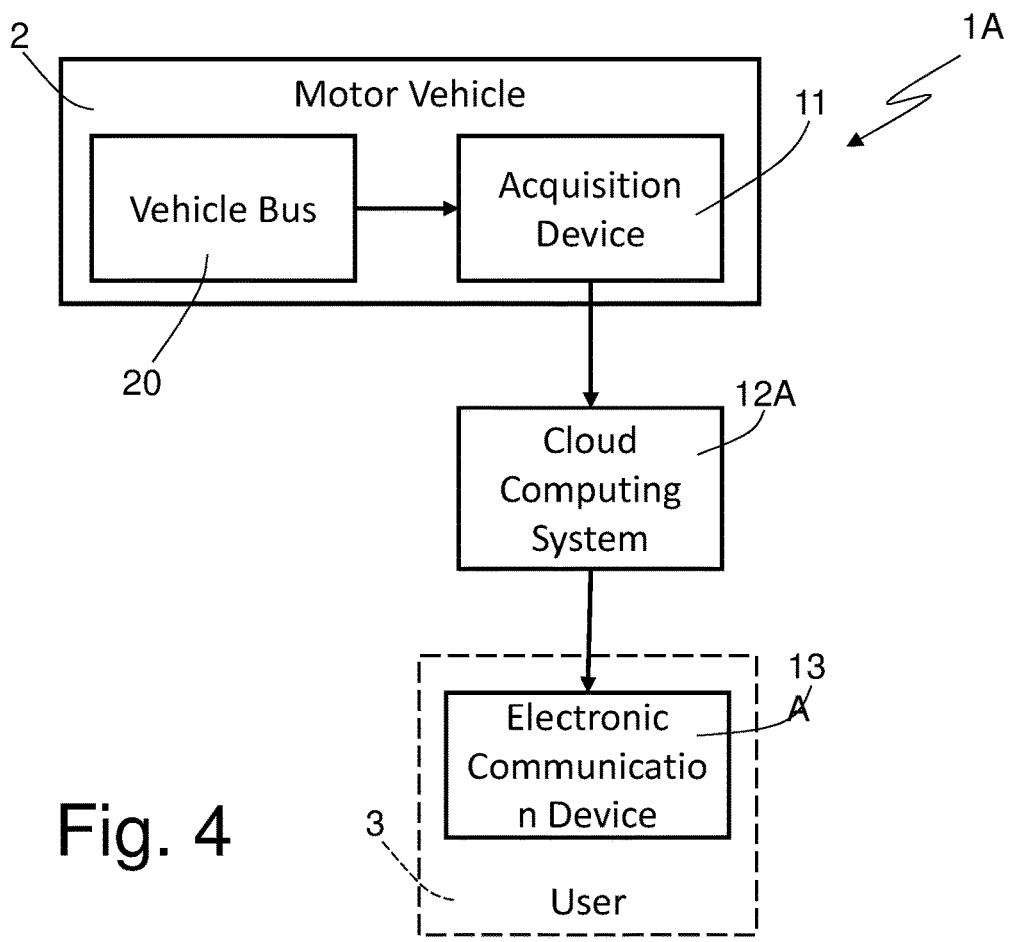
FIGS. 4 and 5 schematically illustrate two specific preferred embodiments of the motor vehicle battery wear monitoring system of FIG. 3.
Figure 5:
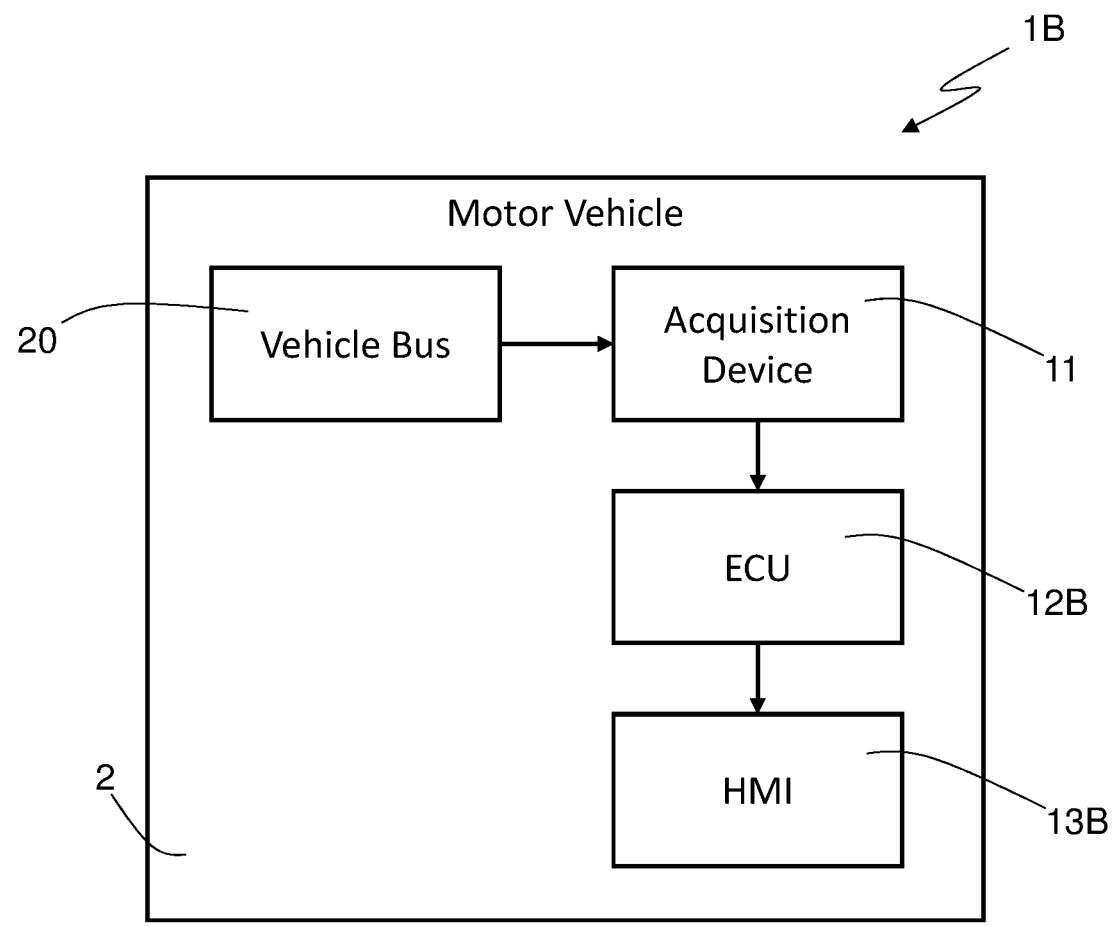

FIGS. 4 and 5 schematically illustrate two specific preferred embodiments of the motor vehicle battery wear monitoring system 1.

In particular, with reference to FIG. 4, in a first specific preferred embodiment (denoted as a whole by 1A) of the motor vehicle battery wear monitoring system 1:
- the processing device/system 12 is implemented/carried out by means of a cloud computing system 12A that is wirelessly and remotely connected to the acquisition device 11 (e.g., via one or more mobile communications technologies, such as GSM, GPRS, EDGE, HSPA, UMTS, LTE, LTE Advanced and/or future 5th generation (or even beyond) wireless communications systems); and the notification device 13 is implemented/carried out by means of an electronic communication device 13A (such as a smartphone, a tablet, a laptop, a desktop computer, a smart TV, a smartwatch, etc.), which is associated with (e.g., owned and/or used by) the user (in FIG. 4 denoted by 3) associated with the motor vehicle (in FIG. 4 denoted by 2), and which is remotely connected to the cloud computing system 12A via one or more wired and/or wireless networks.

Preferably, the cloud computing system 12A is programmed to, if it detects an approaching battery failure, send an approaching battery failure notification to the electronic communication device 13A that provides the user 3 with said approaching battery failure notification. For example, the notification device 13 may conveniently be a smartphone or tablet on which a software application (i.e., a so-called app) is installed, which app is configured to receive, from the cloud computing system 12A, a push notification indicating a detected approaching battery failure. Other types of approaching battery failure notification may be also used, such as SMS messages, email messages or, more in general, messages of text and/or audio and/or image and/or video and/or multimedia type(s). The same preferably applies also in case of detected anomalous current drain from the battery.

It is worth noting that the cloud computing system 12A may be advantageously used to provide many motor vehicles 2 and, hence, many users 3 with a motor vehicle battery wear monitoring service.

Instead, with reference to FIG. 5, in a second specific preferred embodiment (denoted as a whole by 1B) of the motor vehicle battery wear monitoring system 1:

the processing device/system 12 is implemented/carried out by means of an (automotive) Electronic Control Unit (ECU) 12B installed on board the motor vehicle 2; and the notification device 13 is implemented/carried out by means of a Human-Machine Interface (HMI) 13B provided on board the motor vehicle 2.

In said second specific preferred embodiment 1B, the ECU 12B may conveniently warn a driver of the motor vehicle 2 against a detected approaching battery failure via a graphical and/or sound alert produced by the HMI 13B (which, thence, may conveniently comprise a screen and/or a graphical/sound warning indicator). The same preferably applies also in case of detected anomalous current drain from the battery.

The ECU 12B may conveniently be an ECU specifically dedicated to battery wear monitoring, or an ECU dedicated to several tasks including also battery wear monitoring.

Similarly, the HMI 13B may conveniently be a HMI specifically dedicated to battery wear monitoring, or a HMI dedicated to several tasks including also battery wear monitoring (e.g., a HMI of an onboard infotelematics and/or driver assistance system).

In view of the foregoing, a motor vehicle battery wear monitoring method according to a preferred embodiment of the present invention includes a battery wear monitoring step that comprises providing and operating the motor vehicle battery wear monitoring system 1 to detect approaching battery failure events (and, preferably, also anomalous current drain events from the battery).

Conveniently, the motor vehicle battery wear monitoring method further includes a preliminary step that comprises carrying out experimental tests and/or computer simulations to determine the predefined voltage rise threshold $T_{A_{VR}}$ (and, preferably, also the predefined battery voltage threshold $T_{V_B}$) used by the processing device/system 12, in the battery wear monitoring step, to detect approaching battery failure events.

Conveniently, in the preliminary step, a respective voltage rise threshold $T_{A_{VR}}$ (and, preferably, also a respective battery voltage threshold $T_{V_B}$) may be determined for each type/model of battery. Alternatively, a respective voltage rise threshold $T_{A_{VR}}$ (and, preferably, also a respective battery voltage threshold $T_{V_B}$) may be determined for a specific type/model of battery installed on board a specific model/type of motor vehicle. Otherwise, a single voltage rise threshold $T_{A_{VR}}$ (and, preferably, also a single battery voltage threshold $T_{V_B}$) may be determined for any type/model of battery installed on board any motor vehicle.

From the foregoing, the technical advantages and the innovative features of the present invention are immediately clear to those skilled in the art.

In particular, it is important to point out that the present invention allows detecting and, hence, predicting an approaching failure of a motor vehicle battery (so that appropriate servicing, such as battery replacement, may be carried out in time) in a very efficient and reliable way by means of a simple system architecture and a simple methodology. In this respect, it is worth noting that the present invention, contrary to the motor vehicle battery diagnosing method according to EP 1 396 729 B1, does not require the use of a voltage sensor connected to the terminals of the battery to sense, at each engine start-up, a plurality of battery-voltage-related parameters, nor the knowledge of the air and water temperatures, nor the use of several databases.

Additionally, the present invention preferably allows detecting also anomalous current drain events from the battery when the motor vehicle is at rest with the ICE being off.

In conclusion, it is clear that numerous modifications and variants can be made to the present invention, all falling within the scope of the invention, as defined in the appended claims.

The invention claimed is:

1. A motor vehicle battery wear monitoring system comprising:
    an acquisition device installed on board a motor vehicle that is equipped with an internal combustion engine, a battery for providing a battery voltage, an alternator, and a starter motor for starting up the internal combustion engine, wherein the acquisition device is configured to receive the battery voltage and to output quantities indicative of said battery voltage;
    a processing system configured to receive the quantities indicative of the battery voltage from the acquisition device, and perform a battery voltage monitoring based on the quantities indicative of the battery voltage to detect an approaching battery failure;
    wherein the battery voltage monitoring includes, for each start-up of the internal combustion engine:
        detecting a respective first voltage value that is a minimum value assumed by the battery voltage just after the starter motor has started operating to start up the internal combustion engine;
        detecting a respective second voltage value assumed by the battery voltage just after the internal combustion engine has been started up, the starter motor has stopped operating and the alternator has started operating;

computing a respective voltage rise value indicative of a difference between the respective first and second voltage values; and detecting an approaching battery failure if the respective voltage rise value meets a predefined condition with respect to a predefined voltage rise threshold.

2. The motor vehicle battery wear monitoring system of claim 1, wherein the battery voltage monitoring further includes:

detecting an anomalous current drain from the battery when the motor vehicle is at rest with the internal combustion engine being off; and detecting an approaching battery failure if, when the motor vehicle is at rest with the internal combustion engine being off, the battery voltage becomes lower than a predefined battery voltage threshold.

3. The motor vehicle battery wear monitoring system of claim 2, wherein the acquisition device is configured to produce the quantities indicative of the battery voltage by using:

a first predefined sampling frequency within a time window that starts at an engine ignition command from a user associated with the motor vehicle and ends when the alternator starts operating; and a second predefined sampling frequency outside said time window, wherein the second predefined sampling frequency is lower than the first sampling frequency.

4. The motor vehicle battery wear monitoring system of claim 2, further comprising a notification device configured to:

if an approaching battery failure is detected by the processing system, warn a user associated with the motor vehicle against the approaching battery failure detected; and if an anomalous current drain from the battery is detected by the processing system, warn the user against the detected anomalous current drain from the battery.

5. The motor vehicle battery wear monitoring system of claim 4, wherein:

the processing system is a cloud computing system that is wirelessly and remotely connected to the acquisition device; and the notification device is an electronic communication device associated with the user and remotely connected to the cloud computing system via one or more wired and/or wireless networks.

6. The motor vehicle battery wear monitoring system of claim 4, wherein:

the processing system is an electronic control unit installed on board the motor vehicle; and the notification device is a human-machine interface provided on board the motor vehicle.

7. The motor vehicle battery wear monitoring system of claim 1, further comprising a notification device configured, if an approaching battery failure is detected by the processing system, to warn a user associated with the motor vehicle against the approaching battery failure detected.

8. A method of monitoring battery wear for a motor vehicle that is equipped with an internal combustion engine, a battery for providing a battery voltage, an alternator, and a starter motor for starting up the internal combustion engine, the method comprising:

acquiring, via an acquisition device installed on board the motor vehicle, quantities indicative of the battery voltage;

for each start-up of the internal combustion engine:

detecting a respective first voltage value that is a minimum value assumed by the battery voltage just after the starter motor has started operating to start up the internal combustion engine;

detecting a respective second voltage value assumed by the battery voltage just after the internal combustion engine has been started up, the starter motor has stopped operating and the alternator has started operating;

computing a respective voltage rise value indicative of a difference between the respective first and second voltage values; and detecting an approaching battery failure if the respective voltage rise value meets a predefined condition with respect to a predefined voltage rise threshold.

9. The method of claim 8, further comprising:

detecting an anomalous current drain from the battery when the motor vehicle is at rest with the internal combustion engine being off; and detecting an approaching battery failure if, when the motor vehicle is at rest with the internal combustion engine being off, the battery voltage becomes lower than a predefined battery voltage threshold.

10. The method of claim 9, further comprising:

if an approaching battery failure is detected, generating an output to warn a user associated with the motor vehicle against the detected approaching battery failure; and if an anomalous current drain from the battery is detected, generating an output to warn the user against the detected anomalous current drain from the battery.

11. The method of claim 9, wherein the quantities indicative of the battery voltage are generated by using:

a first predefined sampling frequency within a time window that starts at an engine ignition command from a user associated with the motor vehicle and ends when the alternator starts operating; and a second predefined sampling frequency outside said time window, wherein the second predefined sampling frequency is lower than the first sampling frequency.

12. The method of claim 8, further comprising, if an approaching battery failure is detected, generating an output to warn a user associated with the motor vehicle against the detected approaching battery failure.

13. A cloud computing system configured to:

receive quantities indicative of a battery voltage from an acquisition device installed on board a motor vehicle that is equipped with an internal combustion engine, a battery for providing the battery voltage, an alternator, and a starter motor for starting up the internal combustion engine; and perform a battery voltage monitoring based on the quantities indicative of the battery voltage to detect an approaching battery failure;

wherein the battery voltage monitoring includes, for each start-up of the internal combustion engine:

detecting a respective first voltage value that is a minimum value assumed by the battery voltage just after the starter motor has started operating to start up the internal combustion engine;

detecting a respective second voltage value assumed by the battery voltage just after the internal combustion engine has been started up, the starter motor has stopped operating and the alternator has started operating;

computing a respective voltage rise value indicative of a difference between the respective first and second voltage values; and detecting an approaching battery failure if the respective voltage rise value meets a predefined condition with respect to a predefined voltage rise threshold.

14. The cloud computing system of claim 13, wherein the battery voltage monitoring further includes:
   detecting an anomalous current drain from the battery when the motor vehicle is at rest with the internal combustion engine being off; and
   detecting an approaching battery failure if, when the motor vehicle is at rest with the internal combustion engine being off, the battery voltage becomes lower than a predefined battery voltage threshold.

15. The cloud computing system of claim 14, being further configured, if an approaching battery failure is detected by the processing system, to generate an output to warn a user associated with the motor vehicle against the detected approaching battery failure.

16. The cloud computing system of claim 14, being further configured, if an anomalous current drain from the battery is detected by the processing system, to generate an output to warn the user against the detected anomalous current drain from the battery.

17. An electronic control unit to be installed on board a motor vehicle that is equipped with an internal combustion engine, a battery for providing the battery voltage, an alternator, and a starter motor for starting up the internal combustion engine, the electronic control unit configured to:
   receive quantities indicative of a battery voltage from an acquisition device installed on board the motor vehicle; and
   perform a battery voltage monitoring based on the quantities indicative of the battery voltage to detect an approaching battery failure;
   wherein the battery voltage monitoring includes, for each start-up of the internal combustion engine:
     detecting a respective first voltage value that is a minimum value assumed by the battery voltage just after the starter motor has started operating to start up the internal combustion engine;
     detecting a respective second voltage value assumed by the battery voltage just after the internal combustion engine has been started up, the starter motor has stopped operating and the alternator has started operating;
     computing a respective voltage rise value indicative of a difference between the respective first and second voltage values; and
     detecting an approaching battery failure if the respective voltage rise value meets a predefined condition with respect to a predefined voltage rise threshold.

18. The electronic control unit of claim 17, wherein the battery voltage monitoring further includes:
   detecting an anomalous current drain from the battery when the motor vehicle is at rest with the internal combustion engine being off; and
   detecting an approaching battery failure if, when the motor vehicle is at rest with the internal combustion engine being off, the battery voltage becomes lower than a predefined battery voltage threshold.

19. The electronic control unit of claim 18, being further configured, if an approaching battery failure is detected by the processing system, to generate an output to warn a user associated with the motor vehicle against the detected approaching battery failure.

20. The electronic control unit of claim 18, being further configured, if an anomalous current drain from the battery is detected by the processing system, to generate an output to warn the user against the detected anomalous current drain from the battery.

* * * * *